United States Patent
Zhang

(10) Patent No.: US 11,024,687 B2
(45) Date of Patent: Jun. 1, 2021

(54) ARRAY SUBSTRATE WITH A PIXEL DEFINING LAYER WITH GROOVE BETWEEN SUB-PIXEL AREAS

(71) Applicant: YUNGU (GU'AN) TECHNOLOGY CO., LTD., Langfang (CN)

(72) Inventor: Panlong Zhang, Kunshan (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 0 days.

(21) Appl. No.: 16/746,989

(22) Filed: Jan. 20, 2020

(65) Prior Publication Data

US 2020/0152720 A1   May 14, 2020

Related U.S. Application Data

(63) Continuation of application No. PCT/CN2019/085901, filed on May 7, 2019.

(30) Foreign Application Priority Data

Jul. 6, 2018   (CN) .......................... 201810734202.7

(51) Int. Cl.
  *H01L 33/00*   (2010.01)
  *H01L 31/0232*  (2014.01)
  (Continued)

(52) U.S. Cl.
  CPC ...... *H01L 27/3246* (2013.01); *H01L 27/3272* (2013.01); *H01L 27/3283* (2013.01); *H01L 51/56* (2013.01)

(58) Field of Classification Search
  CPC .............. H01L 27/3295; H01L 27/3283; H01L 27/3246; H01L 27/3272; H01L 51/56
  See application file for complete search history.

(56) References Cited

U.S. PATENT DOCUMENTS 8,653,511 B2   2/2014 Shin
9,666,650 B2 *  5/2017 Zhang ..................... H01L 21/77
(Continued)

FOREIGN PATENT DOCUMENTS

CN   101026180 A   8/2007
CN   103887261 A   6/2014
(Continued)

OTHER PUBLICATIONS

Office Action of Chinese Patent Application No. 201810734202.7.
(Continued)

*Primary Examiner* — Alonzo Chambliss
(74) *Attorney, Agent, or Firm* — Kilpatrick Townsend & Stockton

(57) ABSTRACT

The present application provides a display substrate, including an array substrate and a pixel defining layer. The pixel defining layer is formed on the array substrate and defines a plurality of sub-pixel areas. The pixel defining layer further defines a first groove, and the first groove is arranged to surround a sub-pixel area of the plurality of sub-pixel areas. When the display panel receives a falling impact, the impact is transferred to the pixel defining layer, so that the pixel defining layer expands in its extending direction. The groove is similar to a structure of a wall performing a function of releasing stresses and reducing expansion of the pixel defining layer. The present application further discloses a method for manufacturing a display substrate, and a display panel.

14 Claims, 5 Drawing Sheets

(51) Int. Cl.
  *H01L 21/00*   (2006.01)
  *H01L 51/40*   (2006.01)
  *H01L 27/32*   (2006.01)
  *H01L 51/56*   (2006.01)

(56) References Cited

U.S. PATENT DOCUMENTS

| | | | |
|---|---|---|---|
| 2010/0213827 A1 | 8/2010 | Yoshida et al. | |
| 2014/0159064 A1* | 6/2014 | Sakariya | H01L 33/06 257/88 |
| 2015/0243704 A1* | 8/2015 | Lee | H01L 51/5271 257/79 |
| 2015/0364715 A1* | 12/2015 | Yoon | H01L 51/5225 257/40 |
| 2016/0155784 A1* | 6/2016 | Park | H01L 27/3246 257/88 |
| 2016/0284774 A1* | 9/2016 | Zhang | H01L 27/1218 |
| 2016/0359142 A1* | 12/2016 | Huangfu | H01L 27/3246 |
| 2017/0047385 A1* | 2/2017 | Teng | H01L 27/3246 |
| 2018/0301521 A1 | 10/2018 | Yang | |
| 2018/0342563 A1 | 11/2018 | You et al. | |
| 2018/0366524 A1* | 12/2018 | Bang | H01L 51/0021 |
| 2019/0067625 A1 | 2/2019 | Yu | |
| 2019/0103418 A1* | 4/2019 | Han | H01L 27/3246 |
| 2020/0235178 A1* | 7/2020 | Shin | H01L 51/5056 |

FOREIGN PATENT DOCUMENTS

| | | |
|---|---|---|
| CN | 203746831 U | 7/2014 |
| CN | 105244454 A | 1/2016 |
| CN | 105489631 A | 4/2016 |
| CN | 105810716 A | 7/2016 |
| CN | 105845711 A | 8/2016 |
| CN | 106449702 A | 2/2017 |
| CN | 106876331 A | 6/2017 |
| CN | 106981584 A | 7/2017 |
| CN | 107068721 A | 8/2017 |
| CN | 107104130 A | 8/2017 |
| CN | 107134543 A | 9/2017 |
| CN | 107170904 A | 9/2017 |
| CN | 107256882 A | 10/2017 |
| CN | 107359263 A | 11/2017 |
| CN | 206774550 U | 12/2017 |
| CN | 107611162 A | 1/2018 |
| CN | 207116483 U | 3/2018 |
| CN | 108074951 A | 5/2018 |
| CN | 108091677 A | 5/2018 |
| CN | 108807494 A | 11/2018 |
| EP | 3648190 A1 | 5/2020 |
| KR | 100722103 B1 | 5/2007 |
| KR | 20160092142 A | 8/2016 |
| WO | 2019047661 A1 | 3/2019 |

OTHER PUBLICATIONS

International Search Report of International Patent Application No. PCT/CN2019/085901.
The Second Office Action of Chinese Patent Application No. 201810734202.7.

* cited by examiner

US 11,024,687 B2

ARRAY SUBSTRATE WITH A PIXEL DEFINING LAYER WITH GROOVE BETWEEN SUB-PIXEL AREAS

CROSS-REFERENCES TO RELATED APPLICATIONS

This application is a continuation application for International Application PCT/CN2019/085901, titled "DISPLAY SUBSTRATE, METHOD FOR MANUFACTURING THE DISPLAY SUBSTRATE, AND DISPLAY PANEL", filed on May 7, 2019, which claims the priority benefit of Chinese Patent Application No. 201810734202.7, titled "DISPLAY SUBSTRATE AND METHOD FOR MANUFACTURING THE DISPLAY SUBSTRATE, DISPLAY PANEL AND DISPLAY APPARATUS" and filed on Jul. 6, 2018. The entireties of both applications are incorporated by reference herein for all purposes.

TECHNICAL FIELD

The present application relates to the field of display technology.

BACKGROUND

An Organic Light-Emitting Diode (OLED) display panel has advantages of thin thickness, self-light-emitting performance, lower power consumption and good flexibility, and is regarded as the most promising flat panel display device.

To seek better visual experiences and tactile experiences, the requirements for the active area and the thickness of an OLED display panel become higher and higher.

SUMMARY

In view of this, it is necessary to provide display substrates, methods for manufacturing the display substrates, and display panels to overcome the problem that the display panel in the prior art is prone to display defects when the display panel is bent or receives falling impacts.

The present application provides a display substrate, including: an array substrate, and a pixel defining layer, formed on the array substrate and defining a plurality of sub-pixel areas.

The pixel defining layer defines at least one groove, and each of the at least one groove is arranged to surround a sub-pixel area of the plurality of sub-pixel areas.

Optionally, each of the sub-pixel areas is configured to be surrounded by at least one of the at least one groove.

Optionally, each of the sub-pixel areas is configured to be surrounded by a plurality of grooves of the at least one groove.

Optionally, a number of the plurality of grooves arranged to surround each of the sub-pixel areas is from 2 to 5.

Optionally, each of the at least one groove includes a plurality of sub-grooves disposed and spaced apart in a circumferential direction around the sub-pixel area.

Optionally, a width of each of the at least one groove is from 2 μm to 10 μm.

Optionally, the at least one groove penetrates the pixel defining layer in a direction perpendicular to the array substrate.

Optionally, a material of the pixel defining layer includes an organic material, and is blended with an inorganic material.

Optionally, the display substrate further includes a shading portion arranged in the at least one groove.

Optionally, the at least one groove is a plurality of grooves, and the shading portion is arranged in a portion of the plurality of grooves.

Optionally, the shading portion includes a cathode material or a color filter material.

Optionally, each of the sub-pixel areas is configured to be surrounded by a plurality of grooves of the at least one groove, and the shading portion is only formed in two grooves of the plurality of grooves, which are spaced apart by another groove of the plurality of grooves.

Optionally, in the direction perpendicular to the array substrate, a size of a section of each of the at least one groove decreases gradually towards the base substrate.

The present application further provides a method for manufacturing a display substrate, including: providing an array substrate; forming a pixel defining layer on the array substrate, and patterning the pixel defining layer to form at least one groove; wherein each of the at least one groove is arranged to surround a sub-pixel area of a plurality of sub-pixel areas.

Optionally, patterning the pixel defining layer to form at least one groove, includes: exposing, by means of a mask, and developing the pixel defining layer to form the at least one groove.

Optionally, after patterning the pixel defining layer to form at least one groove, the method further includes: forming a shading portion in a portion of the at least one groove.

Optionally, the pixel defining layer is a polyimide material layer; and the pixel defining layer is formed by curing.

Optionally, a curing time of the pixel defining layer is from 30 minutes to 60 minutes; and a curing temperature of the pixel defining layer is from 230° C. to 270° C.

According to the display substrate and the method for manufacturing the display substrate, the groove is formed to surround the sub-pixel area in the pixel defining layer. When the display panel receives a falling impact, the impact stresses are transferred to the pixel defining layer, so that the pixel defining layer expands in its extending direction. The groove is arranged to surround the sub-pixel area and is similar to a structure of wall, which can perform a function of releasing the stresses and reduce the expansion of the pixel defining layer, thereby effectively preventing the pixel defining layer from squeezing the OLED devices and avoiding the malfunctions of the OLED devices. In addition, when the display panel is a flexible display panel, the arrangement of the grooves can further improve the flexibility of the flexible display panel more effectively. In such a way, the strength for bearing falling impacts and the flexural strength of the display panel are improved.

The present application further provides a display panel, including a display substrate, an organic light-emitting unit and an encapsulation layer; wherein the display substrate includes: an array substrate, and a pixel defining layer, formed on the array substrate and defining a plurality of sub-pixel areas. The pixel defining layer defines at least one groove, and each of the at least one groove is arranged to surround a sub-pixel area of the plurality of sub-pixel areas. The organic light-emitting unit is formed in the sub-pixel area, and the encapsulation layer is formed at a side of the organic light-emitting unit, which is away from the array substrate.

Optionally, a number of the at least one groove surrounding the sub-pixel areas located in a central portion of the active area of the display panel is greater than a number of the at least one groove surrounding the sub-pixel areas located in a portion of the active area of the display panel, which is proximate to a frame.

According to the above display panel, the groove is formed to surround the sub-pixel area in the pixel defining layer. When the display panel receives a falling impact, the impact stresses are transferred to the pixel defining layer, so that the pixel defining layer expands in its extending direction. The groove is arranged to surround the sub-pixel area and is similar to a structure of wall, which can perform a function of releasing the stresses and reduce the expansion of the pixel defining layer, thereby effectively preventing the pixel defining layer from squeezing the OLED devices to cause the malfunctions of the OLED devices. In addition, when the display panel is a flexible display panel, the arrangement of the grooves can further improve the flexibility of the flexible display panel more effectively. In such a way, the strength for bearing falling impacts and the flexural strength of the display panel are improved.

DETAILED DESCRIPTION OF THE INVENTION

Figure 1:
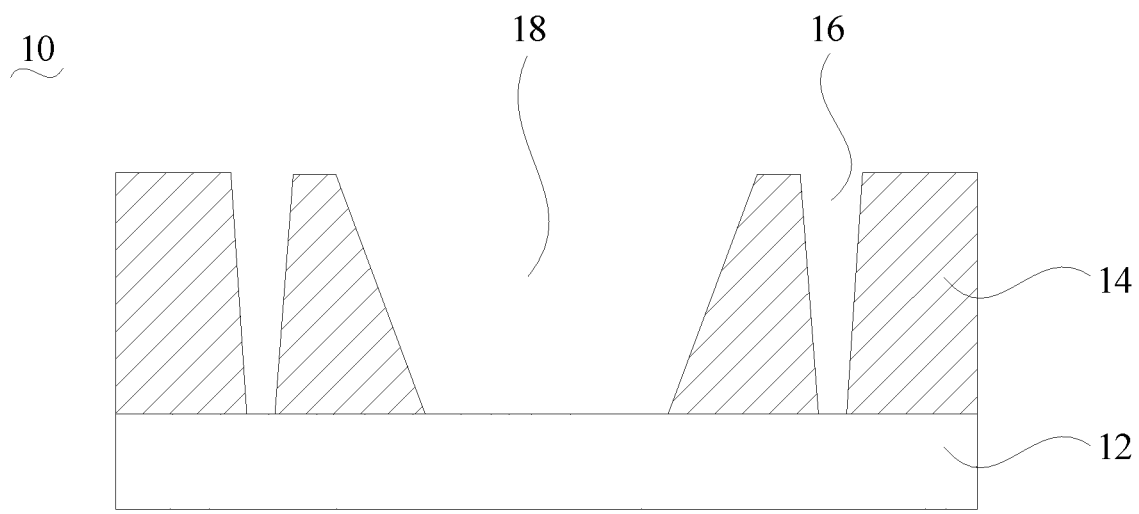
FIG. 1 is a structural diagram illustrating a display substrate of an embodiment of the present application.

Along with the increasing of the active area and the decreasing of the thickness, the strength of the display panel is thereby decreased as well. Particularly, when the flexible OLED display panel is bent or curved many times or receives a falling impact, the bending area and the impacted area cannot display full color and are prone to display defects such as dark spots, bright spots and colored spots.

To facilitate understanding the present application, it will be described hereinafter more thoroughly with reference to the related accompanying drawings. The preferred embodiments of the present application are provided in the accompanying drawings. However, the present application can be implemented in various forms, and is not limited to the embodiments described herein. Instead, the objective of these provided embodiments is to make the disclosed description of the present application understood more thoroughly.

With the rapid development of the OLED display panel technology, the OLED display panels are widely used due to their bendability and better flexibility. However, due to the limitations of structure and material, the strength for bearing falling impacts and the flexural strength of the OLED display panels are not high.

Taking the test for bearing a falling impact as an example, when a falling ball (a steel ball having a diameter of 20 mm; falling height from 2 cm to 62.5 cm) weighing 32.65 g impacts the OLED display panel, the encapsulation layer is bent downwards in the direction of the acting force, and then the stresses are transferred to the structure inside the encapsulation layer. Since the stresses concentrate and cannot be dispersed at the very instant that the falling ball impacts on the display panel, the display panel is prone to damage when the falling height exceeds 10 cm. It is likely that the impacted area cannot display full color, and the display defects such as dark spots, bright spots, colored spots and the like can occur.

To solve this problem, a buffer layer is usually arranged at a side away from a light emitting side of the display, for example, optically clear adhesive is filled between the display panel and the cover plate. However, in this way, the thickness of the display will be increased to a certain extent, which cannot meet better visual experiences and tactile experiences, and increases the manufacturing processes and the manufacturing difficulty.

Therefore, it is necessary to provide a display panel, which can guarantee the thickness and the display effect and has better flexural strength and better strength for bearing falling impacts.

When describing an orientation relationship, unless otherwise specified, an element, such as a layer, a film or a substrate, when referred to as "on" another element, it can be directly on the other element, or intervening elements can also be provided therebetween. Furthermore, when a layer is referred to be "under" another layer, it may be directly under the other layer, or one or more intervening layers can also be provided. It may also be understood that, when a layer is referred to "between" two layers, it may be the only one layer between the two layers, or one or more intervening layers are provided.

An array substrate, i. e. TFT (Thin-Film Transistor) array substrate, refers to a base substrate (such as, a substrate comprises PI materials) having a TFT array and anodes formed thereon.

It should be understood that the display panel provided in the embodiments of the present application substantially refers to a display panel applied to a full-screen or a frameless display, of course, it can also refer to a display panel applied to a common display with a frame or with a narrow frame.

Figure 2:
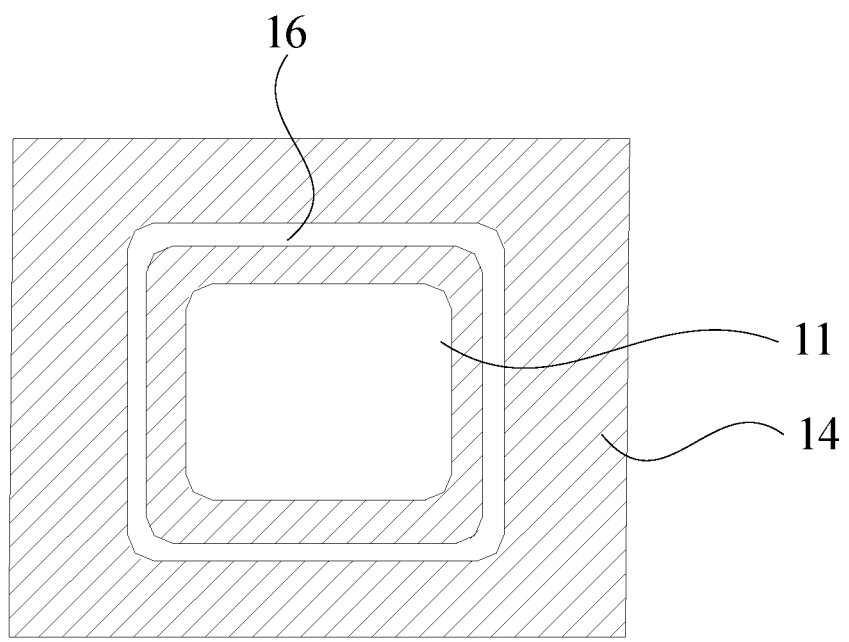
FIG. 2 is a structural diagram illustrating the display substrate shown in the FIG. 1 from another viewing angle.

FIG. 1 is a structural diagram illustrating a display substrate of an embodiment of the present application. FIG. 2 shows a structural diagram illustrating the display substrate shown in FIG. 1 from another viewing angle. For the convenience of the description, only the structures related with the embodiments of the present application are shown in the accompanied drawings.

Referring to the drawings, the display panel provided in the embodiments of the present application includes a display substrate 10, an organic light-emitting unit, a cathode and an encapsulation layer. The display substrate 10 includes an array substrate 12 and a pixel defining layer 14.

The array substrate 12 includes a base substrate (for example, formed by PI materials), thin-film transistors (not shown) arranged on the base substrate, and anodes arranged on the thin-film transistors. Of course, the array substrate 12 can further include film layers, such as a planarization layer, a passivation layer, and the like, which are not limited herein. For example, in some embodiments, the array substrate 12 has a plurality of sub-pixel areas 11, which can be categorized into a first sub-pixel area emitting red light, a second sub-pixel area emitting blue light, and a third sub-pixel area emitting green light. The first sub-pixel area, the second sub-pixel area and the third sub-pixel area in a group can constitute a pixel area. The anodes, i. e. the pixel electrodes, can be formed on the planarization layer and correspond to the corresponding sub-pixel areas 11 one-to-one.

In some other embodiments, each pixel area can also include other sub-pixel areas 11, which are not limited herein. For example, each pixel area can also include a fourth sub-pixel area 11 emitting white light.

The pixel defining layer 14 is formed on the array substrate 12, and at least a portion of each pixel electrode is exposed. In some embodiments, the pixel defining layer 14 can cover at least a portion of an edge of each pixel electrode, such that at least a portion of each pixel electrode is exposed. In some preferred embodiments, the pixel defining layer 14 can be provided with a plurality of pixel defining openings 18. A central portion of the pixel electrode or the entire pixel electrode is exposed via the pixel defining opening 18. In other words, the sub-pixel areas 11 can be defined by the corresponding pixel defining opening 18, thereby defining a plurality of sub-pixel areas.

The pixel electrodes can be formed on the planarization layer, and the pixel defining layer 14 can also be formed on the planarization layer. The height from the planarization layer to the upper surface of the pixel defining layer 14 is greater than the height from the planarization layer to the upper surface of the pixel electrode. The pixel defining layer 14 can cover at least a portion of the edge of each pixel electrode so as to form the plurality of pixel defining openings 18, and organic light-emitting material is filled in the pixel defining openings 18.

In this way, the pixel defining layer 14 can increase the distance between the end of each pixel electrode and an opposite electrode (for example, the cathode) formed on each pixel electrode, thereby preventing the end of the pixel electrode from anti-reflection.

Usually, materials of the pixel defining layer 14 substantially include organic materials, such as polyimide, polyamide, benzocyclobutene, acrylic resin, phenolic resin, or the like. Of course, in some other embodiments, the pixel defining layer 14 can also be blended with inorganic materials, such as tin oxide, tantalum nitride and/or tin oxynitride. In the practical manufacturing process, the encapsulation layer may touch the pixel defining layer 14. Therefore, blending the pixel defining layer 14 with inorganic materials can increase the adhesion of the pixel defining layer 14 with the lower inorganic material layer of the encapsulation layer, so as to prevent the cathode, for example, from being shed to a certain extent, thereby improving the reliability of the display panel.

The organic light-emitting unit includes at least an organic light-emitting material layer. In some embodiments, the organic light-emitting unit can have a multi-layered structure. For example, besides the organic light-emitting material layer, the organic light-emitting unit can further include an electron transfer layer and a hole transfer layer for balancing electrons and holes, and an electron injection layer and a hole injection layer for enhancing the injection of electrons and holes. The cathodes are formed at a side of the organic light-emitting unit, which is away from the array substrate 12. In some embodiments, the cathodes cover the whole display substrate 10. In other words, the cathodes cover the pixel defining layer 14 and are filled in the pixel defining openings formed by the pixel defining layer 14, so as to be connected to the organic light-emitting unit.

Figure 5:
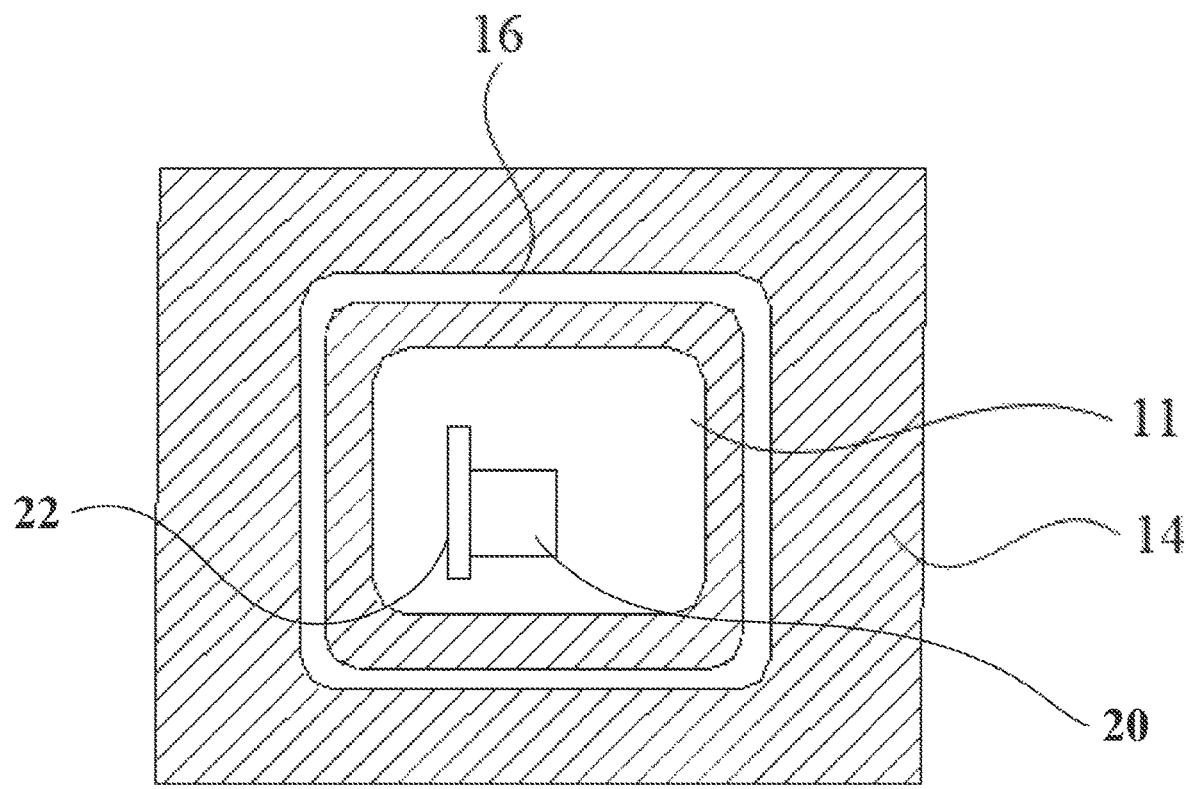
FIG. 5 is a structural diagram illustrating the display substrate shown in the FIG. 1 from another viewing angle according to an embodiment.

The encapsulation layer is arranged at a side of the organic light-emitting unit, which is away from the array substrate 12. Since the organic light-emitting material layer is very sensitive to the external environment, such as moisture and oxygen, if the organic light-emitting material layer of the display panel is exposed in the environment having moisture and oxygen, the performance of the display panel may be sharply decreased, or the display panel may be completely damaged. The encapsulation layer can keep the air and moisture away from the organic light-emitting unit, thereby guaranteeing the reliability of the display panel. For example, as is shown in FIG. 5, an organic light emitting unit 20 is formed in the sub-pixel area 11, and an encapsulation layer 22 is arranged at a side of the organic light-emitting unit 20.

The encapsulation layer can be a single-layered or multiple-layered structure, and can be an organic film layer or an inorganic film layer, or a stack structure of an organic film layer and an inorganic film layer. For example, in some embodiments, the encapsulation layer can include two inorganic film layers and an organic film layer located between the two inorganic film layers.

Continuing to refer to FIG. 1, the display substrate 10 of the embodiment of the present application further includes at least one groove 16 formed in the pixel defining layer 14. Each groove 16 is arranged to surround a sub-pixel area 11 of the plurality of sub-pixel areas 11.

When the display panel is bent many times or receives a falling impact, the encapsulation layer may bend downwards in the direction of the acting force, thereby the bending stresses or the impact stresses can be transferred to the film layers, such as the support layer, the cathodes, the pixel defining layer 14, and the like. In view of an arrangement structure and arrangement form of the pixels on the existing display substrates 10, among the elements occupying the space of the display substrate 10, except the organic light-emitting unit, the pixel defining layer 14 occupies the most space.

In general, the pixel defining layer 14 is substantially made of organic material, for example, polyimide, polyamide, benzocyclobutene, acrylic resin, phenolic resin, or the like. By means of tests for the falling impacts, when a falling ball (a steel ball having a diameter of 20 mm; a falling height from 2 cm to 62.5 cm) weighing 32.65 g impacts the display panel, since the pixel defining layer 14 occupies a larger space, the stresses concentrate substantially in the pixel defining layer 14 after the impact stresses are transferred to the pixel defining layer 14, and cannot disperse, so that the pixel defining layer 14 expands to squeeze the OLED devices, which causes the OLED devices to malfunction.

The groove 16 is formed to surround the sub-pixel area 11 in the pixel defining layer 14. When the display panel receives a falling impact, the impact stresses are transferred to the pixel defining layer 14, so that the pixel defining layer 14 expands in its extending direction. The arrangement that the groove 16 is arranged to surround the sub-pixel area 11 and is similar to a structure of wall, which can perform a function of releasing the stresses and reduce the expansion of the pixel defining layer 14, thereby effectively preventing the pixel defining layer 14 from squeezing the OLED devices and avoiding the malfunctions of the OLED devices. In addition, when the display panel is a flexible display panel, the arrangement of the grooves 16 can further improve the flexibility of the flexible display panel more effectively.

In such a way, the strength for bearing falling impacts and the flexural strength of the display panel are improved.

Due to the arrangement of the groove 16, while formed by the subsequent deposition, the cathode can be filled in the groove 16, or may not be filled in the groove 16. For example, to prevent the cathode from being filled in the groove 16, the farther the deposition rate of the cathode the better.

In some embodiments, one or more above-mentioned grooves 16 can be provided to surround each sub-pixel area 11. In other embodiments, one or more above-mentioned grooves 16 can be provided to surround only a portion of the sub-pixel areas 11, which will not be limited herein specifically. In the context, "more" refers to being greater than or equal to two.

The number of the grooves 16 surrounding each sub-pixel area 11 can be same, or different, which is not limited herein specifically. Taking the test for bearing a falling impact as an example, in the test, since the falling ball is apt to impact the central location of the active area of the display panel, a larger number of the grooves 16 are provided to surround the sub-pixel areas 11 located in the central portion of the active area, and an appropriately reduced number of the grooves 16 are provided to surround the sub-pixel areas 11 located in a portion of the active area, which is proximate to the frame. Taking bending many times as an example, a larger number of the grooves 16 are provided around the sub-pixel areas 11 in the bending area, and an appropriately reduced number of the grooves 16 are provided around the sub-pixel areas 11 in the non-bending area.

Each groove 16 is arranged to surround a sub-pixel area 11. The groove 16 can be formed continuously, or can include a plurality of sub-grooves that are arranged and spaced apart in the circumferential direction of the sub-pixel area 11. The groove is not limited herein specifically, as long as it can realize the purpose for reducing the expansion generated by the pixel defining layer 14 when receiving an impact.

In some embodiments of the present application, a plurality of grooves 16 are arranged to surround the sub-pixel area 11, and the adjacent grooves 16 are arranged and spaced apart. The larger the number of the grooves 16, the greater the released stresses, and the lower the expansion ratio of the cured pixel defining layer 14. However, the larger the number of the grooves 16, the more difficult the patterning process, and the lower the rigidity of the pixel defining layer 14, so that the strength for bearing falling impacts is reduced. When the number of the grooves 16 is increased to a certain extent, and when the falling height of the falling ball exceeds 10 cm, the display panel is still prone to damage.

When the number of the grooves 16 surrounding a sub-pixel area 11 of the plurality of sub-pixel areas 11 is from 2 to 5, the rigidity of the pixel defining layer 14 may not be greatly affected, while the expansion ratio is decreased, thereby effectively preventing the pixel defining layer 14 from squeezing the OLED device to cause malfunctions of the OLED devices, and further improving the strength for bearing falling impacts and the flexural strength of the display panel. As a preferred embodiment, the number of the grooves 16 surrounding each sub-pixel area 11 is three, which facilitates processing, and under the premise of guaranteeing the rigidity of the pixel defining layer 14, decreases the expansion ratio of the pixel defining layer 14.

The larger the number of the grooves 16 and the larger the widths of the grooves 16, the smaller the expansion extent of the pixel defining layer 14 under an acting force. However, the space of the pixel defining layer 14 between adjacent sub-pixel areas 11 is limited. Only when the number of the grooves 16 surrounding each sub-pixel area 11 falls within a range and the width of the grooves 16 falls in a suitable range, can the rigidity of the pixel defining layer 14 be guaranteed, and can the expansion ratio of the pixel defining layer 14 under an acting force be decreased. In an specified embodiment, when the width of the grooves 16 is from 2 μm to 10 μm, the above-mentioned effects may be achieved.

In some embodiments of the present application, the groove 16 penetrates the pixel defining layer 14 in a direction perpendicular to the array substrate 12. After the encapsulation layer receives a falling impact, the encapsulation layer bends downwards in the direction of the acting force, thereby the bend stresses or the impact stresses are transferred downwards. The lower layer of the pixel defining layer 14 has a greater influence on the OLED devices, therefore, as a preferred embodiment, the groove 16 should penetrate the pixel defining layer 14, or the depth of the groove 16 is slightly smaller than the depth of the pixel defining layer 14, so as to decrease the damages to the OLED devices when the pixel defining layer 14 expands to squeeze the OLED devices.

Figure 3:
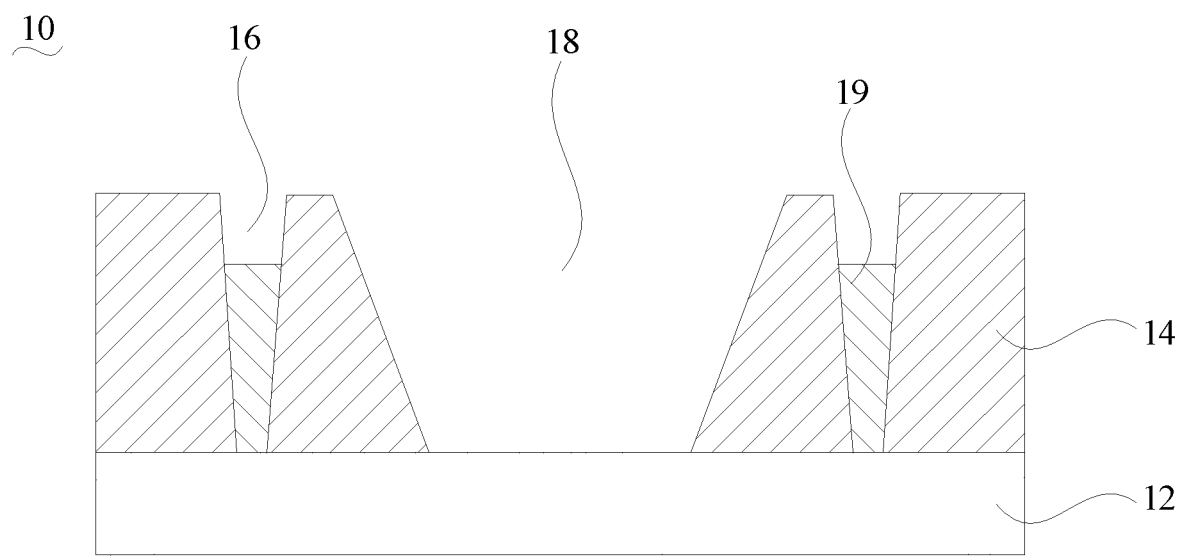
FIG. 3 is a structural diagram illustrating the display substrate of another embodiment of the present application.

FIG. 3 is a structural diagram illustrating the display substrate of another embodiment of the present application.

Referring to FIG. 3, in some embodiments of the present application, the display substrate 10 further includes a shading portion 19 located in the groove 16. In the existing OLED pixels structure, there is a light leak problem of a lateral light leak between two pixels. Arranging the shading portion 19 in the groove 16 can, to a certain extent, avoid the lateral light leak, and do not affect the opening ratio of the pixel defining opening 18 of the pixel defining layer 14.

The shading portions 19 can be arranged in each groove 16, or may also be arranged in a portion of the grooves 16, which is not limited herein specifically. As limited by the factors such as the expansion performance of the material of the shading portion 19, if each groove 16 is provided with the shading portion 19 therein, the expansion performance of the pixel defining layer 14 under an acting force may be affected. Therefore, for the flexible display panel, as a preferred embodiment, the shading portions 19 are provided in a portion of the grooves 16. For example, in some embodiments, a plurality of grooves 16 are arranged to surround each pixel area, while the shading portions 19 are only formed in two grooves 16 that are spaced apart by another groove 16. Specifically, for example, taking the sub-pixel area 11 as a reference, the shading portions 19 are formed from inside to outside in the groove 16 of a first circle and in the groove 16 of a third circle.

Specifically, in some embodiments, the shading portion 19 can comprise a cathode material, that is, while the cathode layer is being deposited at a side of the organic light-emitting unit, which is away from the array substrate 12, the shading portion 19 is formed by the deposit in the groove 16 simultaneously. In other embodiments, the shading portion 19 can also comprise a color filter material, such a Red filter material, a Blue filter material, a Green filter material, and the like. In order to decrease the expansion ratio of the pixel defining layer 14 under an acting force, the material of the shading portion 19 should be the material having a relative lower expansion ratio under an acting force, and the thickness of the shading portion 19 is equal to or less than the thickness of the organic light-emitting unit.

In some embodiments of the present application, in the direction perpendicular to the array substrate 12, the size of the section of the groove 16 gradually decreases towards the base substrate. For example, specifically in the embodiment shown in FIG. 1, the section of the groove 16 is in a shape of an inverted trapezoid, and the size of the section of the groove 16 gradually decreases from the upper end to the lower end, thereby reducing the influence of the expansion of the lower layer of the pixel defining layer 14 on the OLED devices, and further improving the strength for bearing falling impacts and the flexural strength of the display panel.

The above-mentioned groove 16 is formed in the pixel defining layer 14 by patterning the pixel defining layer 14 through a patterning process. For example, in some embodiments, the groove 16 is formed by exposing through a mask and then developing the pixel defining layer 14. Of course, in other embodiments, the groove 16 can be formed by mean of dry etching. Compared with the dry etching process, the half-tone process of exposing through the mask and developing has a simple process, and in the half-tone process the depth of the groove 16 is more easily to be controlled.

The pixel defining layer 14 is substantially made of organic materials, therefore it is necessary to cure the pixel defining layer 14 after the patterning process is completed. Compared with the pixel defining layer 14 without the groove 16, the cured pixel defining layer 14 has a lower expansion ratio because of the arrangement of the groove 16, thereby effectively preventing the pixel defining layer 14, after receiving the impact, from squeezing the OLED devices to cause malfunctions of the OLED devices.

In order to further understand the technical solutions of the present application, the embodiment of the present application further provides a method for manufacturing the display substrate 10.

Figure 4:
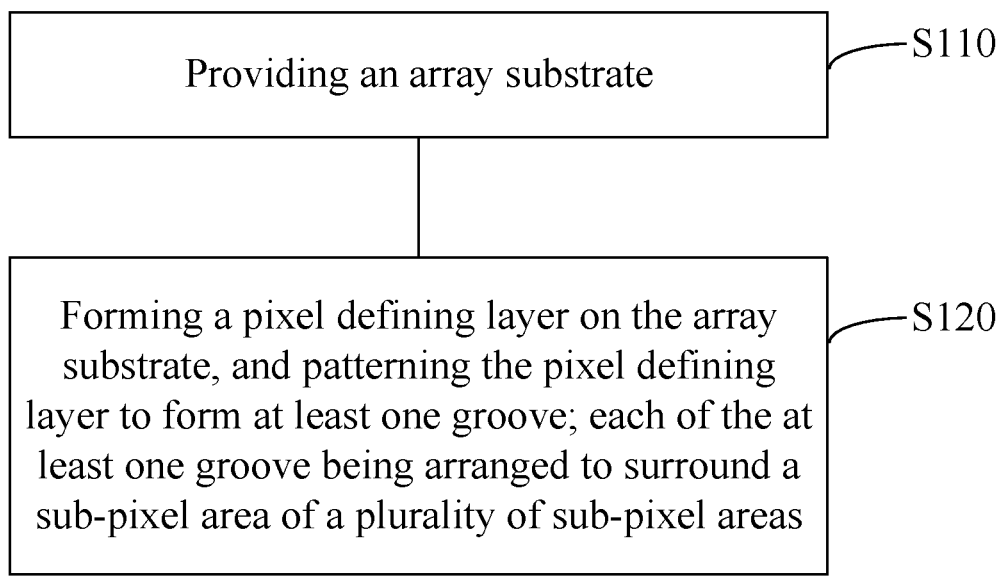
FIG. 4 is a flow chart of a method for manufacturing the display substrate of an embodiment of the present application.

FIG. 4 is a flow chart of a method for manufacturing the display substrate 10 of an embodiment of the present application.

Referring to the figure, the method for manufacturing the display substrate 10 of the embodiment of the present application includes the following steps.

At a step S110, provide an array substrate 12.

The array substrate 12 includes a base substrate, thin-film transistors and anodes arranged on the thin-film transistors.

Taking a flexible display panel as an example, the base substrate is formed on a supporting substrate. The base substrate is a bendable substrate, and optionally is formed by organic polymer, silicon nitride, and silicon oxide. For example, the organic polymer substrate can be one of a polyimide substrate, a polyamide substrate, a polycarbonate substrate, a polyether sulphone substrate. In some embodiments, the base substrate can be formed by coating the colloid liquid of polyimide on the supporting substrate, and then curing the polyimide.

The thin-film transistors are formed on the base substrate. In some embodiments, another layer, such as a buffer layer can be formed on the base substrate before the thin-film transistors are formed. The buffer layer can be formed on the whole surface of the base substrate, and can also be formed by patterning.

The buffer layer can include suitable materials such as polyethylene terephthalate (PET), polyethylene naphthalate (PEN), polyacrylate and/or polyimide and the like, and can be formed to be a layered structure in the form of a single-layered or a multiple-layered stack. The buffer layer can also be formed by silicon oxide or silicon nitride, or can be a composite layer including an organic material layer and/or an inorganic material layer.

The thin-film transistors can control the emission of each sub-pixel, or can control the emission amount of each sub-pixel when the sub-pixel emits light. The thin-film transistor can include a semiconductor layer, a gate electrode, a source electrode and a drain electrode. The semiconductor layer can be formed by an amorphous silicon layer, a metal oxides or polysilicon layer, or can be formed by organic semiconductor material. In some embodiments, the semiconductor layer includes a channel region, and a source region and a drain region blended with dopants.

A gate insulating layer can be adopted to cover the semiconductor layer, and the gate electrode can be arranged on the gate insulating layer. Substantially, the gate insulating layer can cover the whole surface of the base substrate. In some embodiments, the gate insulating layer can be formed by patterning. In consideration of the adherence of adjacent layers, the formability and surface planarization of the stacked objective layer, the gate insulation layer can be formed by silicon oxide, silicon nitride or other insulating organic or inorganic materials. The gate electrode can be covered by an insulating interlayer formed by silicon oxide, silicon nitride and/or other suitable insulating organic or inorganic materials. A portion of the gate insulating layer and the insulating interlayer can be removed, to form contact apertures to expose a predetermined area of the semiconductor layer. The source electrode and the drain electrode can contact the semiconductor layer via the contact apertures.

Since the thin-film transistor has a complicated layered structure, the top surface of the thin-film transistor may be not plane. In some embodiments, the thin-film transistor further includes a planarization layer to form an adequately plane top surface. After the planarization layer is formed, through apertures can be formed in the planarization layer to expose the source electrode and the drain electrode of the thin-film transistor.

The anode is the pixel electrode. The pixel electrode includes a sub-pixel electrode corresponding to the sub-pixel area 11. A plurality of sub-pixel electrodes are formed on the planarization layer. It is easily to understand that the plurality of sub-pixel electrodes are electrically connected to the thin-film transistors via the above-mentioned through apertures.

At a step S120, the pixel defining layer 14 is formed on the array substrate 12, and the pixel defining layer 14 is patterned to form at least one groove 16; each groove 16 is arranged to surround a sub-pixel area 11 of the plurality of sub-pixel areas 11.

The pixel defining layer 14 can be formed by organic material, such as polyimide, polyamide, benzocyclobutene, acrylic resin, phenolic resin, or the like. Of course, in some other embodiments, the pixel defining layer 14 can also be blended with inorganic material, such as tin oxide, tantalum nitride and/or tin oxynitride.

The pixel defining layer 14 is patterned by a patterning process, to form the groove 16. For example, in some embodiments, the groove 16 is formed by exposing through the mask and then developing the pixel defining layer 14. In other embodiments, the groove 16 is formed by an etching process. It can be understood that the patterning processes can also be other forms, which include, but are not limited to, the two above-mentioned exemplary forms.

The groove 16 is formed to surround the sub-pixel area 11 in the pixel defining layer 14. When the display panel receives a falling impact, the impact is transferred to the pixel defining layer 14, so that the pixel defining layer 14 expands in its extending direction. The groove 16 is provided to surround the sub-pixel area 11, and is similar to a structure of a wall, which can perform a function of releasing the stresses and reduce the expansion of the pixel defining layer 14, thereby effectively preventing the pixel defining layer 14 from squeezing the OLED devices to cause malfunctions of the OLED devices. In addition, when the display panel is a flexible display panel, the arrangement of the grooves 16 can further improve the flexibility of the flexible display panel more effectively.

In such a way, the strength for bearing falling impacts and the flexural strength of the display panel are improved.

In some embodiments, the pixel defining layer 14 is a polyimide material layer and is formed by curing; the curing time of the pixel defining layer 14 is from 30 minutes to 60 minutes; and the curing temperature of the pixel defining layer 14 is from 230° C. to 270° C. The pixel defining layer 14 is substantially formed by organic materials. Under conditions of different temperatures and different curing time, the expansion coefficients of the cured organic material under an acting force are different.

When the display panel is bent many times or receives a falling impact, the encapsulation layer bends downwards in the directions of the acting forces, thereby the bending stresses or the impact stresses are transferred to the pixel defining layer 14. The pixel defining layer 14 has better strength, and the lower the expansion ratio of the pixel defining layer 14, the lower the risk that the pixel defining layer 14 squeezes the OLED devices to cause damages to the OLED devices. When the curing temperature of the pixel defining layer 14 is from 230° C. to 270° C., and when the curing time is from 30 minutes to 60 minutes, the cured pixel defining layer 14 has higher mechanical strength and a lower expansion ratio, thereby effectively preventing the pixel defining layer 14 from squeezing the OLED devices to cause malfunctions of the OLED devices.

The pixel defining layer 14 can also be blended with inorganic materials, such as tin oxide, tantalum nitride and/or tin oxynitride, or blended with some nano inorganic particles. In such a way, on one hand, the expansion coefficient of the pixel defining layer 14 can be reduced, and on the other hand, the adhesion of the pixel defining layer 14 with the inorganic material layer in the lower layer of the encapsulation layer can be increased, thereby preventing the cathode, for example, from being shed to a certain extent, and improving the reliability of the display panel. Furthermore, when the temperature of the inorganic material rises or drops, its volume expands or shrinks. If the surface activity capacity of atoms is poor, a loose structure will be formed eventually. If the atoms are buried by the subsequent film layer before the atoms have been adjusted to the lowest energy positions on the growing film surface, then the activation energy of the atoms increases, and structural defects will be generated as well. Therefore, there may be a large number of structure defects (such as vacancies, vacancy clusters, and the like) in the pixel defining layer 14. The disordered layer formed by these structural defects becomes the origin of tensile stress or compressive stress of the pixel defining layer 14. Since the disordered layer itself is structurally unstable, if it is thermally activated (such as by a kinetic energy transfer of the deposited atoms and a release of condensation heat) subsequently, then an atomic rearrangement occurs, and the disordered layer transfers to a denser low-energy structure, generating lateral shrinkage.

When the curing time of the pixel defining layer 14 is from 30 minutes to 60 minutes, and when the curing temperature is from 230° C. to 270° C., the formation of the structural defects inside the pixel defining layer 14 can be reduced, thereby reducing the residual stresses. In such a way, the mechanical performance of the pixel defining layer 14 is further improved, and the expansion ratio of the pixel defining layer 14 is lowered, thereby effectively preventing the pixel defining layer 14 from squeezing the OLED devices to cause malfunctions of the OLED devices.

According to the above-mentioned display panel, an embodiment of the present application further provides a display apparatus. In some embodiments, the display apparatus may be a display terminal, for example, a tablet computer. In other embodiments, the display apparatus can also be a mobile communication terminal, such as a mobile phone terminal.

In some embodiments, the display apparatus includes a display panel and a control unit, and the control unit is configured to transmit a display signal to the display panel.

In summary, the groove 16 is formed to surround the sub-pixel area 11 in the pixel defining layer 14. When the display panel receives a falling impact, the impact stresses are transferred to the pixel defining layer 14, so that the pixel defining layer 14 expands in its extending direction. The groove 16 is provided to surround the sub-pixel area 11 and is similar to a structure of a wall, which can perform a function of releasing the stresses and reduce the expansion of the pixel defining layer 14, thereby effectively preventing the pixel defining layer 14 from squeezing the OLED devices to cause malfunctions of the OLED devices. In addition, when the display panel is a flexible display panel, the arrangement of the grooves 16 can further improve the flexibility of the flexible display panel more effectively.

In such a way, the strength for bearing falling impacts and the flexural strength of the display panel are improved.

Further, at least a part of steps of FIG. 4 can include multiple sub-steps or stages which can be performed at different times or can be accomplished at the same time, which can be performed in turn or alternately with other steps or at least a part of the sub-steps or stages of the other steps, rather have to be performed sequentially.

All of the technical features in the embodiments can be employed in arbitrary combinations. For purpose of simplifying the description, not all arbitrary combinations of the technical features in the embodiments illustrated above are described. However, as long as such combinations of the technical features are not contradictory, they should be considered as within the scope of the description of the present application.

The above embodiments are merely illustration of several implementations of the application, and the description thereof is more specific and detailed, but should not be regarded as limitations to the scope of the present application. It should be noted that for those skilled in the art, various modifications and improvements can be made without departing from the conception of the present application, and they are within the scope of the present application. Therefore, the scope of the present application should be defined by the appended claims.

The invention claimed is:

1. A display substrate comprising:
   an array substrate; and
   a pixel defining layer formed on the array substrate and defining a plurality of sub-pixel areas, the pixel defining layer comprising a first groove, the first groove defining a sub-pixel area of the plurality of sub-pixel areas and being arranged to surround the sub-pixel area of the plurality of sub-pixel areas, the pixel defining layer further comprising a first shading portion disposed within the first groove and surrounding the sub-pixel area, the shading portion comprising a fill material having an expansion ratio lower than an expansion ratio of the pixel defining layer.

2. The display substrate of claim 1, wherein the display substrate comprises a plurality of grooves, the plurality of grooves comprising the first groove, each of the sub-pixel areas is configured to be surrounded by one of the plurality of grooves.

3. The display substrate of claim 1, wherein the display substrate comprises a plurality of grooves, the plurality of grooves comprising the first groove, each of the sub-pixel areas is configured to be surrounded by at least two of the plurality of grooves.

4. The display substrate of claim 3, wherein a number of the plurality of grooves arranged to surround each of the sub-pixel areas is from 2 to 5.

5. The display substrate of claim 1, wherein the first groove comprises a plurality of sub-grooves disposed and spaced apart in a circumferential direction around the sub-pixel area.

6. The display substrate of claim 1, wherein a width of the first groove is about 2 μm to 10 μm.

7. The display substrate of claim 1, wherein the first groove penetrates the pixel defining layer in a direction perpendicular to the array substrate.

8. The display substrate of claim 1, wherein a material of the pixel defining layer comprises an organic material blended with an inorganic material, the pixel defining layer being formed by curing.

9. The display substrate of claim 1, wherein the display substrate comprises a plurality of grooves, the plurality of grooves comprising the first groove, and the shading portion is arranged in a portion of the plurality of grooves.

10. The display substrate of claim 1, wherein the shading portion comprises a cathode material or a color filter material.

11. The display substrate of claim 1, wherein each of the sub-pixel areas is configured to be surrounded by a plurality of grooves, the plurality of grooves comprising the first groove, and the shading portion is only formed in two grooves of the plurality of grooves, the two grooves being spaced apart by another groove of the plurality of grooves.

12. The display substrate of claim 1, wherein the display substrate comprises a plurality of grooves, the plurality of grooves comprising the first groove, and in a direction perpendicular to the array substrate, a size of a section of the first groove decreases gradually towards the base substrate.

13. A display panel, comprising a display substrate, an organic light-emitting unit and an encapsulation layer;
wherein the display substrate comprises:
an array substrate, and
a pixel defining layer formed on the array substrate and defining a plurality of sub-pixel areas,
the pixel defining layer comprising a first groove defining a sub-pixel area of the plurality of sub-pixel areas, the first groove being arranged to surround the sub-pixel area of the plurality of sub-pixel areas, the pixel defining layer further comprising a first shading portion disposed within the first groove and surrounding the sub-pixel area, the shading portion comprising a fill material having an expansion ratio lower than an expansion ratio of the pixel defining layer; and
wherein the organic light-emitting unit is formed in the sub-pixel area, and the encapsulation layer is formed at a side of the organic light-emitting unit, which is away from the array substrate.

14. The display panel of claim 13, wherein the display substrate comprises a plurality of grooves, the plurality of grooves comprising the first groove, a number of the plurality of grooves surrounding the sub-pixel areas located in a central portion of an active area of the display panel is greater than a number of the plurality of grooves surrounding the sub-pixel areas that are located in a portion of the active area of the display panel, which is proximate to a frame.

* * * * *